United States Patent [19]

Berger

[11] Patent Number: 4,625,301

[45] Date of Patent: Nov. 25, 1986

[54] DYNAMIC MEMORY REFRESH CIRCUIT

[75] Inventor: Michael F. Berger, Fort Worth, Tex.

[73] Assignee: Tandy Corporation, Fort Worth, Tex.

[21] Appl. No.: 556,467

[22] Filed: Nov. 30, 1983

[51] Int. Cl.$^4$ .............................................. G11C 7/00
[52] U.S. Cl. .................................... 365/222; 365/189
[58] Field of Search ... 364/200 MS File, 900 MS File; 365/222, 189

[56] References Cited

U.S. PATENT DOCUMENTS

| | | | |
|---|---|---|---|
| 3,729,722 | 4/1973 | Shuba | 365/222 |
| 3,737,879 | 6/1973 | Green et al. | 365/222 |
| 4,106,108 | 8/1978 | Cislaghi et al. | 365/222 |
| 4,357,686 | 11/1982 | Scheuneman | 365/222 |
| 4,494,222 | 1/1985 | White et al. | 365/222 |

*Primary Examiner*—Terrell W. Fears
*Assistant Examiner*—Guy Miller
*Attorney, Agent, or Firm*—Wolf, Greenfield & Sacks

[57] ABSTRACT

A circuit for generating refresh signals for a dynamic, random access memory is disclosed. The circuit comprises a timer which periodically generates refresh request signals. Each refresh request signal increments a refresh request counter. In normal system operation, after a memory access cycle, a refresh cycle is performed if there is a non-zero count in the counter. At the start of each refresh cycle, the counter is decremented and the refresh address to the memory is changed. Refreshing of the memory continues until the count is zeroed. If, for some reason, memory accesses are not performed within the memory refresh time limit, the count in the counter reaches a critical limit and a non-maskable interrupt is generated to the system processor causing it to access an interrupt vector in the memory and force refresh cycles.

18 Claims, 2 Drawing Figures

DYNAMIC MEMORY REFRESH CIRCUIT

FIELD OF THE INVENTION

This invention relates to computer memory circuits and, in particular, to circuits for refreshing dynamic, random access memories.

BACKGROUND OF THE INVENTION

Computer memories can be categorized into two main types depending on their access characteristics. One type is random access memory (RAM) in which information can be written in and read out of the memory at any location, in any desired sequence with a similar access time for each location.

A second type of computer memory is a read only memory (ROM) in which information can be read out much like a RAM but cannot be written in as freely.

A random access memory typically consists of a plurality of memory cells, an address decoder, read/write control circuitry and a memory output register. There are many details and variations in the connection of the elements and in the structure of each element between various types of memories. A major point of variation between random access memories is the structure of the memory cells used in the memory.

In particular, there are two types of RAM memories commonly in use. In a so-called static RAM memory each cell consists of a flip/flop circuit. Thus, as long as power is supplied to the memory cells the information stored in the cells will be maintained. A flip/flop circuit typically consists of two transistors or other semiconductor devices and has two stable states.

The other type of RAM memory is called a dynamic memory. Each memory cell of the dynamic RAM memory stores information by storing electric charge in a very small capacitance, which is usually called a storage capacitance. Information in the form of "0"s and "1"s is represented by either an electric charge or no charge on the storage capacitance of a particular memory cell. A single transistor is usually used to control the charging of the storage capacitance.

Since the electric charge stored on the storage capacitance gradually leaks away information must periodically be rewritten into the cell before the charge completely leaks out. This periodic rewriting of the information is called "refreshing" the memory. The refreshing frequency depends on the amount of leakage in the control transistor—in a typical dynamic memory refreshing is required every two milliseconds or less.

Although the refreshing operation requires additional circuitry to coordinate the procedure, the dynamic RAM is often used due to certain advantages over the static RAM. For example, because only one control transistor is used in the dynamic RAM instead of two flip/flop transistors in the static RAM, the dynamic RAM occupies a much smaller area than the static RAM. In addition, the dynamic RAM is usually faster and consumes less power. Thus, dynamic RAMS are particularly attractive in mini and micro computers where space and power consumption are at a premium.

In a dynamic RAM, both a memory access (a read or a write to a memory cell) and a refresh operation are performed under control of a combination of signals called a row address strobe (RAS) signals and column address strobe (CAS) signals. In a memory access operation, the RAS and CAS signals are used to select the particular memory cell which is to be accessed. Some dynamic memories require manipulation of both the RAS and the CAS signals to perform a refresh cycle. Other memories can be refreshed by activating the RAS signal.

During a conventional refresh operation, information is read out of a plurality of cells and then rewritten back into the cells where it will remain for up to two milliseconds—the maximum refresh time limit. Conventional refresh circuitry is usually arranged so that a refresh cycle occurs after each memory access. Normally, a whole row of memory cells is refreshed at once. Thus, an access to any cell in a particular row causes the entire row to be refreshed.

Conventional refresh circuitry works well when a sufficient number of memory accesses to refresh the entire memory can be guaranteed within the maximum refresh time limit. In a computer system which has a single block of memory and one memory controller, a sufficient number of memory accesses usually occurs within the required time limit.

However, when a large memory is partitioned into two or more blocks, each independently accessable, then it is possible for all memory accesses occurring within the refresh time limit to occur in one block of the memory. Thus, the maximum refresh time limit for the unaccessed block may be exceeded causing information loss.

One prior art solution to avoid this latter problem is to periodically trigger a refresh cycle by means of a continuously running timer which triggers a DMA (direct memory access) cycle to force a memory refresh cycle. This arrangement insures against loss of data but wastes power and slows down the operation of the memory because unnecessary refresh cycles may be performed both during a normal memory access and immediately afterwards as prompted by the timer.

Accordingly, it is an object of the present invention to provide a memory refresh circuit which refreshes the memory when a memory access is performed.

It is another object of the present invention to provide a memory refresh circuit which can operate in a system in which the memory is partitioned into blocks.

It is a further object of the present invention to provide a memory refresh circuit which forces a refresh of the memory prior to the expiration of the maximum refresh time limit without requiring periodic memory refresh cycles.

It is still another object of the present invention to provide a memory refresh circuit which can prevent the maximum refresh memory time from being exceeded even though no memory accesses are attempted within the time period.

SUMMARY OF THE INVENTION

The foregoing objects are achieved and the foregoing problems are solved in one illustrative embodiment of the invention in which periodic refresh requests generated by a timer are counted and refresh cycles performed after a memory access if a non-zero count exists in the counter. After each refresh cycle the counter is decremented and the refresh addresses are changed. Additional refresh cycles are performed prior to any memory accesses until the count in the counter reaches zero. If no memory accesses are performed within the maximum refresh time limit, the count reaches a predetermined maximum value causing an interrupt to be generated to the system processor. The normal interrupt routine, in turn, causes the processor to access the memory to get an interrupt vector, thereby triggering the required refresh cycles.

In particular, a programmable timer is used to generate periodic refresh requests. These requests increment an up/down counter. The outputs of the counter are provided to a NOR circuit which indicates when a zero count exists. Other circuitry determines when a memory access is requested by the computer and initiates a refresh cycle if a non-zero count exists in the counter. At the start of each refresh cycle, the counter is decremented by one. The refresh cycle is controlled by a delay chain circuit and control logic which continues to trigger refresh cycles until all refresh requests have been satisfied.

DETAILED DESCRIPTION OF THE PREFERRED EMBODIMENT

Figure 1:
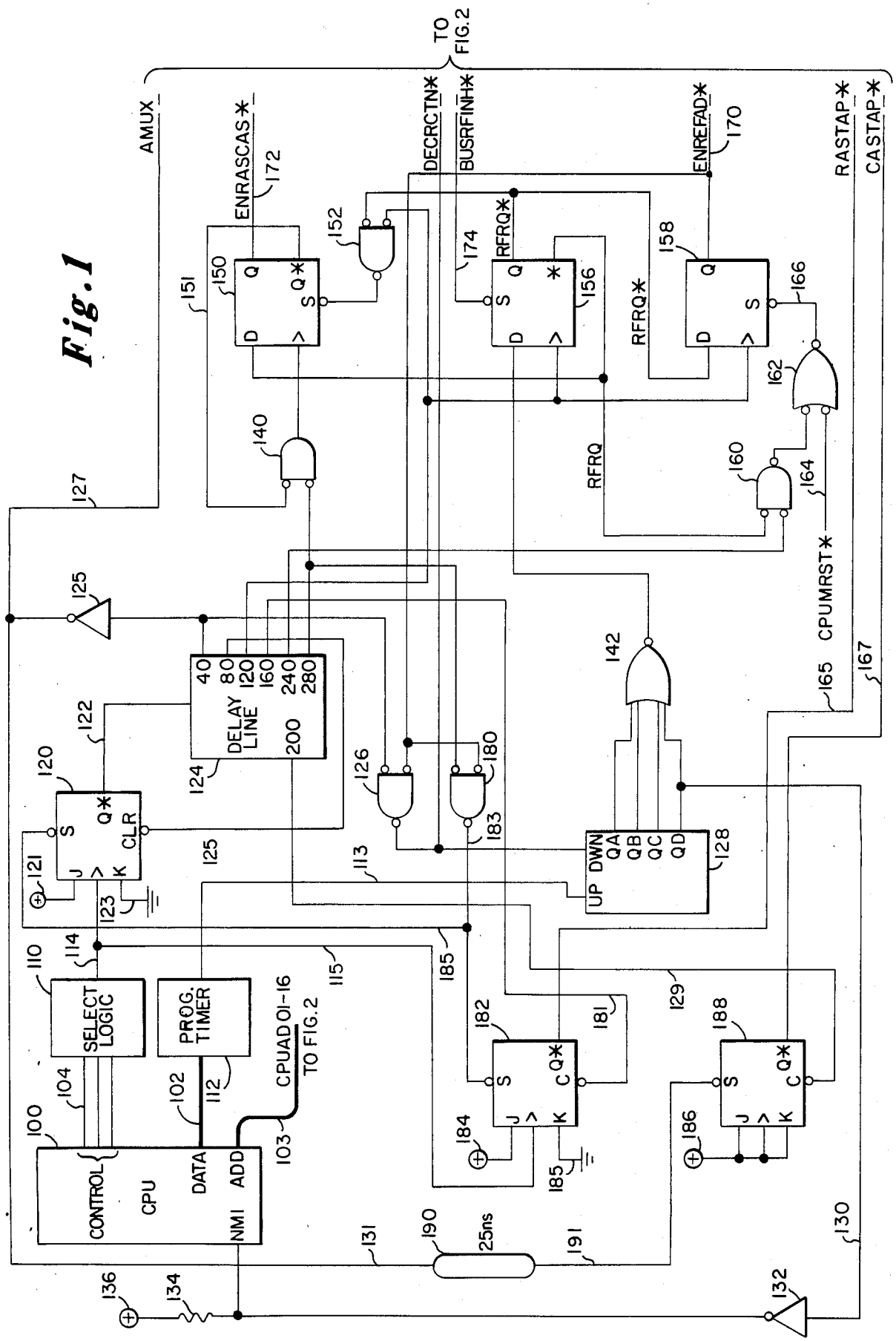
FIG. 1 is an electrical schematic diagram of the illustrative memory refresh circuit including the refresh request counter.

FIG. 1 of the drawing shows a block schematic diagram of an illustrative embodiment of the memory refresh circuitry. The operation of the circuit is controlled and coordinated by central processing unit 100. CPU 100 may be of any well-known construction and typically has three sets of outputs: data leads 102, address leads 103 and control leads 104. Illustratively, CPU 100 may be a 16-bit microprocessor, Model 8086 manufactured by the Intel Corporation. In the model 8086, although data leads 102 and address leads 103 are shown separately in FIG. 1, data leads 102 are actually multiplexed on address leads 103. Separation of the data and address signals by means of logic circuitry is well-known and conventional and forms no part of the invention described herein. Accordingly, the operation of CPU will not be discussed in detail.

Data on CPU output leads 102 may be provided to programmable timer 112. Timer 112 is a conventional device which can be programmed by CPU 100 to generate clock and other timing signals on a periodic basis. In accordance with the illustrative invention, timer 112 is programmed to generate timing pulses with a predetermined period, illustratively 15.5 microseconds. These pulses are the refresh request signals and, as discussed more fully below, each pulse will eventually cause a refresh cycle to occur. A programmable timer which is suitable for use with the illustrative embodiment is a Model 8253-5 programmable counter/timer manufacuctured by by Intel Corporation referred to above.

The 15.5 microsecond pulse signals are provided by timer output 113 to the "up" input of up/down counter 128. In accordance with the invention, counter 128 is the refresh request counter and it allows refresh requests to be temporarily "stored" until a memory access is performed or until a critical limit is reached. In response to each pulse produced by timer 112, counter 128 increments its internal count by one. A counter suitable for use with the present embodiment is a 74LS193 counter.

The outputs QA-QD of counter 128 are provided to NOR gate 142. NOR gate 142, in turn, controls the refresh cycle circuitry to cause it to start a refresh cycle after a memory access as will be hereinafter described. In addition, in accordance with the invention, output QD of counter 128 is provided, via lead 130 and inverter 132, to the non-maskable interrupt (NMI) input of CPU 100. As will hereinafter be described, when the QD output of counter 128 becomes "high" indicating that the counter has reached a critical point, an interrupt is generated at CPU 100 causing it to perform a memory access thereby initiating a refresh cycle.

A refresh cycle is started after a memory access has been requested by CPU 100. CPU 100 controls a memory access (either a read or write operation) by placing a predetermined pattern of control signals on control leads 104. These control signals are provided to selection logic 110 which logically combines the control signals produced by CPU 100 to generate further signals that control the direction and timing of information flow and initiates the provision of address signals to the memories in preparation for the memory access. Logic 110 is conventional and will not be described in detail.

In order to clarify the operation of the inventive memory circuitry, it will first be assumed that a memory access is requested by CPU 100 and no refresh requests are pending in refresh counter 128. In addition to other signals, selection logic 110 produces a "low" signal on its output lead 114 in response to a request by CPU 100 for either a read or write operation as determined by control signals on leads 104.

The first step in the memory access operation started by this "low" signal is the generation of an enabling signal for the RAS signals in order to specify the memory cell to be accessed. The provision of the RAS signals to the memory is started when the "low" signal produced by selection logic 110 is provided, via lead 115, to the clock input of JK flip/flop 182. Flip/flop 182 has its "J" input tied to a positive voltage source 184 and its "K" input tied to ground 185. On the falling edge of the signal provided to its clock input flip/flop 182 becomes "set" and a "low" signal appears at its Q* output. This signal is applied to lead 165 and becomes the RASTAP* signal. The RASTAP* signal is, in turn, applied, via lead 230, in FIG. 2 indirectly to the memory to cause it to recognize incoming address signals as RAS signals. The RASTAP* signal is not applied directly to the memory but is combined in a well-known manner with other timing signals to generate a RAS enable signal which is provided to the memory causing it to latch the RAS address signals into internal registers. The other timing signals are conventional and are generated by well-known circuitry (not shown) and will not be described in detail.

Figure 2:
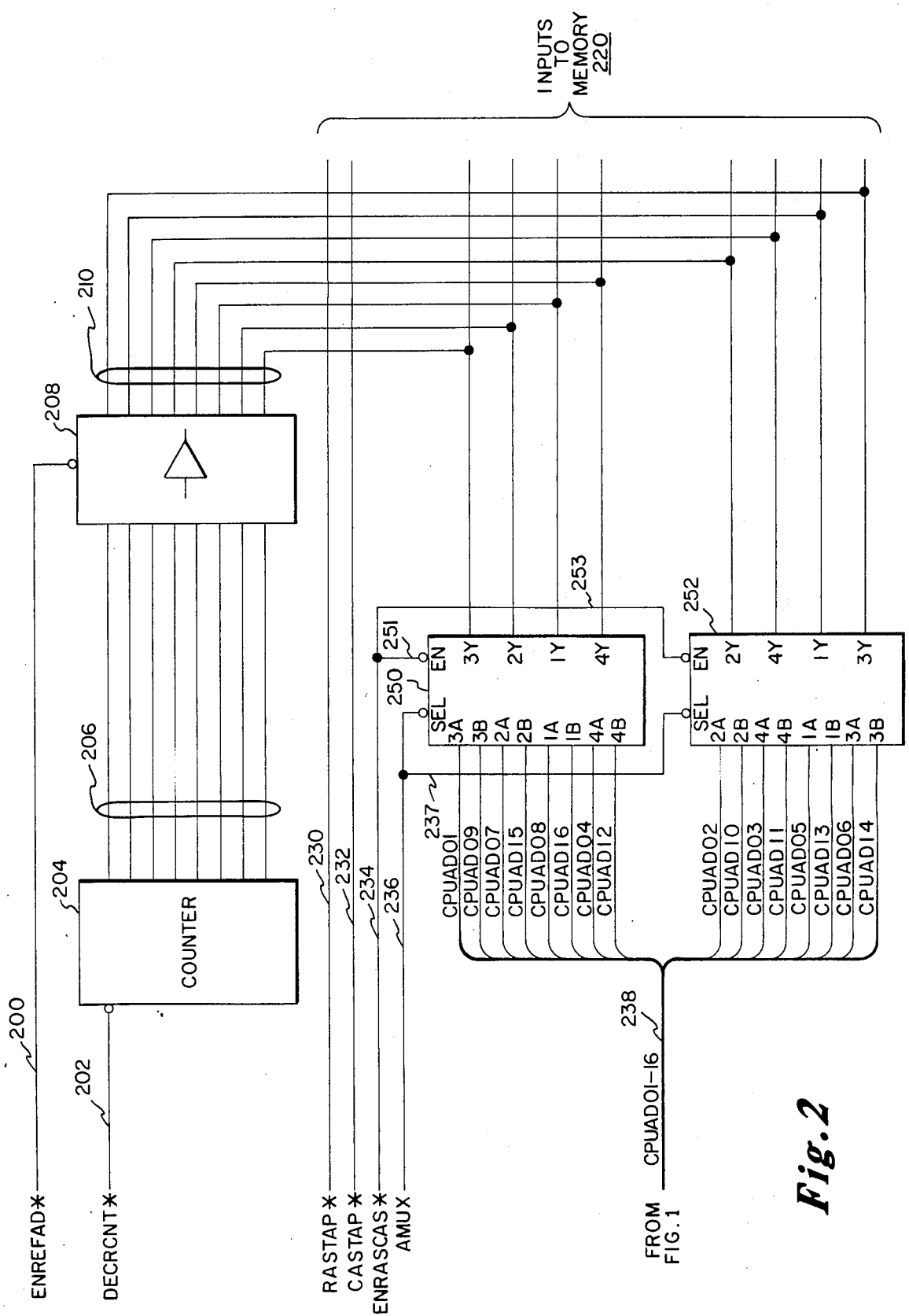
FIG. 2 of the drawing is an electrical schematic diagram of the portion of the refresh circuit which generates the memory address signals.

The actual RAS address signals are generated on CPU address lines CPU01-CPU08 from CPU 100 and are conveyed, via lead 103, in FIG. 1 to lead 238 in FIG. 2. There CPU address leads CPU01-CPU08 are divided between multiplexers 250 and 252, shown in FIG. 2. These multiplexers are illustratively equipped with high impedance outputs which can effectively disconnect the CPU address signals from memory input lines 220 when disabled.

Alternatively, multiplexers 250 and 252 can be enabled by means of a "low" signal appearing on leads 251 and 253, respectively (the ENRASCAS* signal). The multiplexers select either the "A" input or the "B" input to connect to the respective "Y" output depending on the signal applied to the SEL inputs (for example, either the 1A or 1B input is connected to the 1Y output depending on the signal at the SEL input). The SEL inputs of multiplexers 250 and 252 are connected by leads 237 to lead 236 where they receive the AMUX signal from ciruitry shown in FIG. 1. During the RAS cycle the AMUX signal is "low" as will hereinafter described. Multiplexers suitable for use with the illustrative embodiment are device numbers 74F258 manufactured by a number of semiconductor device vendors.

During a memory access operation a "low" ENRAS-CAS* signal is provided to lead 234, via lead 172, (FIG. 1) from the Q output of flip/flop 150 which, as will hereinafter be described, is reset during that operation. Thus, RAS address signals are provided from CPU address lines CPU01-CPU08 through multiplexers 250 and 252 to memory inputs 220.

Returning to FIG. 1, the "low" output of selection logic 110 which triggered the RAS portion of the memory access cycle just described, is also provided, via lead 114, to the clock input of JK flip/flop 120. As with flip/flop 182, flip/flop 120 has its J input tied to a positive voltage supply 121 and its K input tied to ground 123. Thus, in response to the same falling edge on lead 114 which triggered the RAS cycle, flip/flop 120 becomes "set" and a "low" signal appears at its Q* output which "low" signal is applied, via lead 122, to the input of delay line 124.

Delay line 124 generates a sequence of spaced timing signals which control the remainder of the memory access cycle. In particular, delay line 124 is a tapped, nanosecond delay line having seven output taps designated as taps 40, 80, 120, 160, 200, 240 and 280. In accordance with well-known operating principles, delay line 124 produces a duplicate of the signal provided to its input at each of its tapped outputs after predetermined time delays. Thus, a signal appears at the 40 nanosecond output which is equivalent to the input signal delayed by 40 nanoseconds. A similar operation occurs with the remaining outputs.

In particular, after a delay of 40 nanoseconds, the "low" signal provided on lead 122 to the input appears at the 40 nanosecond output. This signal is inverted by invertor 125 and applied as a "high" AMUX signal to lead 127. In FIG. 2, the "high" AMUX signal on lead 236 is applied, via leads 236 and 237, to the SEL input of multiplexers 250 and 252. This "high" signal causes the multiplexers to connect the "B" inputs to the respective "Y" outputs. Therefore, in response to a "high" AMUX signal, CPU address leads CPU09-CPU16 are connected to memory inputs 220. The address signals on CPU09-CPU16 are the CAS address signals which are the remaining signals necessary to select one location in the memory for an access operation.

Again referring to FIG. 1, a CAS cycle is started when the "high" AMUX signal on lead 127 is provided, via lead 131, to 25 nanosecond delay 190. Delay 190 is a well-known device (which may be comprised of a plurality of invertors connected in series) which provides a delay of the signal appearing at its input of 25 nanoseconds. In addition, delay 190 also inverts the signals provided to its output 191. Thus, the "high" signal applied to the AMUX lead appears as a "low" signal on lead 191 after a time delay of 25 nanoseconds. This "low" signal is applied to the set input of flip/flop 188. Flip/flop 188 is a JK flip/flop with its J input, its K input and its clock input tied to positive voltage source 186. Thus, flip/flop 188 is set in response to the "low" signal applied to its set input and, in turn, a "low" signal appears on its Q* output. This low CASTAP* signal is applied, via lead 167, and lead 232 indirectly to the memory causing it to latch the address signals now on its inputs into internal registers. As with the RASTAP* signal, the CASTAP* signal is first combined with other signals prior to being applied to the memory, which additional timing signals are conventional and do not form part of the invention.

Therefore, at this point, both RAS and CAS signals have been applied to, and latched in, the memory and a specified location has been selected. If the operation was a write operation, other circuitry (not shown) generates a write signal that causes the memory to write at the selected location. Otherwise the requested information appears at the memory output which is typically enabled by the CAS signals and is provided to CPU 100 over data paths not shown.

Eighty nanoseconds after the input to delay line 124 becomes "low", a "low" signal appears at the 80 nanosecond delay output which signal is applied, via lead 125, to the clear input of JK flip/flop 120. The "low" signal clears the flip/flop causing a "high" signal to be applied to its Q* output which "high" signal is, in turn, applied to the delay line 124. The effect of the clearing of flip/flop 120 is to cause an 80 nanosecond "low" pulse to propagate through delay line 124. The rising edge at the end of this pulse controls the refresh cycle timing as will hereinafter be described.

The next action in the memory access cycle occurs when the 160 nanosecond delay output of delay line 124 becomes "low". This "low" signal is applied, via lead 181, to the clear input of flip/flop 182, clearing the flip/flop and applying a "high" signal to the RASTAP* lead 165. A "high" signal on the RASTAP* lead terminates the RAS portion of the memory access cycle. At 200 nanoseconds into the memory access cycle, a "low" signal appears at the 200 nanosecond delay output of delay line 124. This "low" signal is applied, via lead 129, to the clear input of flip/flop 188 causing a "high" signal to appear on its output Q*, which "high" signal is applied to the CASTAP* lead 167 ending the CAS portion of the memory access cycle. The memory access cycle is now completed.

Assume now that the count in counter 128 is non-zero indicating that refresh requests are pending at the time a memory access cycle begins. As described above the cycle proceeds controlled by timing signals generated by delay line 124. However, if refresh requests are pending, an additional "arbitration" sequence is carried out during the memory access cycle.

Specifically, a non-zero count in counter 128 (indicating at least one pending refresh request) results in a "1" on at least one of counter outputs QA-QD which, in turn, causes a "low" signal to appear at the output of NORgate 142. This "low" signal is applied to the D input of flip/flop 156. At approximately 200 nanoseconds into the memory access cycle, a rising edge appears at the 120 nansecond delay output of delay line 124 (the rising edge of the 80 nanosecond "low" pulse delayed by 120 nanoseconds). This rising edge clocks flip/flop 156. Thus, the "low" output from NORgate 142 is clocked through flip/flop 156 and causes its Q output and the associated RFRQ* line to become "low". Conversely the RFRQ line attached to the Q* output of flip/flop 156 becomes "high". At this point no further action is taken on the refresh requests and the memory access cycle proceeds as described above.

On the next memory access cycle, a refresh cycle is initiated after the memory access has been completed.

In particular, the RAS and CAS portions of the memory access cycle are performed as previously described. However, after the CASTAP* signal is generated effectively completing the memory access cycle, the refresh cycle begins.

Specifically, after a delay of 120 nanoseconds into the memory access cycle, a "low" signal appears at the 120 nanosecond output of delay line 124. This "low" signal is applied to the lower input of gate 152. At this time, gate 152 also receives a "low" signal at its upper input from the RFRQ* output of flip/flop 156 which was previously set during the preceeding "arbitration" time. Gate 152 thereupon applies a "low" signal to the set input of flip/flop 150 setting it and causing a "high" signal to be generated at its Q output. This "high" EN-RASCAS* signal on lead 172 is applied, via lead 234 (FIG. 2) to multiplexers 250 and 252. The high EN-RASCAS* signal causes the multiplexers to go into a high impedance state effectively disconnecting the CPU address signals from the memory input leads 220 in preparation for providing refresh RAS signals to the memory.

In addition, the "low" signal on the RFRQ* line generated by flip/flop 156 is applied to the D input of flip/flop 158 and at 200 nanoseconds into the memory access/refresh cycle this "low" signal is clocked through the flip/flop by the rising edge of the delayed 80 nanosecond pulse generated by delay line 124. A "low" signal then appears at the Q output of flip/flop 158 on ENREFAD* lead 170. This "low" signal is applied, via lead 200 (FIG. 2) to the enable input of drivers 208. The "low" signal switches the drivers from a high impedance state and enables the outputs 206 of counter 204 to be connected, via leads 210, to the memory inputs 220. Counter 204 produces the RAS addresses used for refresh operations. As will hereinafter be described, each time a refresh operation is conducted counter 204 is incremented by the DECRCNT* signal appearing on lead 202. Thus, as each successive refresh occurs new refresh addresss are used so that each row in the memory is refreshed in sequence. Therefore, at this point the normal RAS and CAS addresses have been disconnected and the refresh RAS addresses have been connected to the memory.

The cycle continues and the RASTAP* flip/flop 182 and the CASTAP* flip/flop 188 are reset by the signals appearing at outputs 160 and 200 of delay line 124, as previously discussed, ending the memory access portion of this cycle.

In accordance with the invention, a new refresh cycle is automatically started in order to refresh the memory using the RAS addresses from counter 204. In particular, at 280 nanoseconds into the memory access/refresh cycle, a "low" signal appears at the 280 nanosecond output of delay line 124. This "low" signal is applied to the upper input of gate 180. Since the lower input of gate 180 is provided with a "low" ENREFAD* signal from lead 170, gate 180 provides a "low" signal, via lead 183, to the set input of gate 182 setting the flip/flop and regenerating a "low" signal on the RASTAP* lead. This signal causes the memory to latch the RAS address signals provided by counter 204.

In order to continue the refresh cycle, a second round of timing signals is generated by restarting delay line 124. This second round is caused by the "low" output of gate 180 which is applied, via lead 185, to the set input of JK flip/flop 120. This "low" signal sets the flip/flop producing another "low" signal at its Q* output. This latter "low" signal has the same effect on delay line 124 as when a "low" signal was generated by flip/flop 120 upon its being clocked by select logic 110.

The first action that occurs during this second round of timing signals is that a "low" signal appears at the 40 nanosecond output of line 124. This latter "low" signal is applied to the upper input of gate 126. The lower input of gate 126 is provided with the "low" ENREFAD* signal. Gate 126 thereupon applies a "low" signal to the down count input of refresh counter 128. In accordance with the invention, therefore, each time a refresh cycle is initiated, counter 128 is decremented.

In addition, the "low" DECRCNT* signal at the output of gate 126 is provided, via lead 202, to the count input of counter 204. This increments the counter providing a new set of refresh RAS address signals for refreshing the memory. Operation of the circuitry then proceeds in a similar manner to the first cycle with one exception. The "low" ENREFAD* signal is applied to circuitry (not shown) which generates some of the RAS and CAS enable signals. This "low" signal inhibits the production of the CAS enable signals. These signals, as mentioned above, are not necessary during a refresh operation which only requires RAS signals.

At the end of the refresh cycle, if there are additional refresh requests pending (as indicated by a non-zero count in counter 128), as previously described, gate 180 will restart the refresh cycle again.

Operation continues in this manner until the count in counter 128 reaches zero indicating that all outstanding refresh requests have been satisfied. At this point, NOR gate 142, receiving all "0"s at its inputs, produces a "high" signal at its output which is provided to the D input of flip/flop 156. During the next refresh cycle when a rising edge appears at the 120 nanosecond output of delay line 124 this "high" signal is clocked through flip/flop 156 causing a "high" signal to appear on the RFRQ* lead and a "low" signal to appear on the RFRQ lead.

The "low" signal on the RFRQ lead is applied to the upper input of gate 160. The lower input of gate 160 receives a "low" signal from the 240 nanosecond output of delay line 124 and, at this time, gate 160 applies a "low" signal to the upper input of gate 162 which, in turn, applies a "low" signal, via lead 166, to the set input of flip/flop 158. Flip/flop 158, therefore, becomes set and generates a "high" ENREFAD* signal on lead 170. This "high" signal is applied to driver unit 208 and disconnects the refresh addresses on leads 206 from memory inputs 220. Flip/flop 158 may also be reset by a "low" master reset signal (CPUMRST*) appearing on lead 164 which is applied, via gate 162, as a "low" signal over lead 166 to the set input of flip/flop 158. The "high" ENREFAD* signal is also applied to the lower input of gate 180 disabling the gate and preventing it from restarting the circuitry at the end of the current refresh cycle.

The refresh cycle is completed when a falling edge appears at the 280 nanosecond output of delay line 124. This falling edge signal is applied to the lower input of gate 140. As previously discussed, flip/flop 150 was set by gate 152 in an earlier refresh cycle to decouple CPU addresses from the memory inputs. Therefore, flip/flop 150 has a "low" signal appearing at its Q* output which "low" signal is applied, via lead 151, to the upper input of gate 140 enabling it. Gate 140 therefore applies a rising signal to the clock input of flip/flop 150 clocking in the signal at the D input. The D input of flip/flop 150 is connected to the RFRQ lead which is now "low". Flip/flop 150 thus places a "low" ENRASCAS* signal on lead 172, which signal, as previously mentioned, enables multiplexers 250 and 252 to provide CPU addresses to memory inputs 220 as shown in FIG. 2.

The above sequence of operations describes the normal refresh cycle which is performed after a normal memory access cycle. However, when the inventive system is used with a memory having two or more memory banks it is possible that memory accesses may all be to one bank so that the critical refresh time limit can be exceeded in the other bank before a refresh operation is performed. To prevent this problem from occurring, output QD of refresh counter 128 is tied, via line 30 and invertor 132, to the non-maskable interrupt (NMI) input of CPU 100. With this connection, counter 128 can have up to seven requests pending without deviating from the normal refresh cycle. When an eighth request, however, is received and counter 128 is incremented so that its QD output becomes "high", this "high" signal is applied, via lead 130, to invertor 132 which, in turn, applies a "low" signal to the NMI input of CPU 100. The time interval between refresh requests (illustratively 15.5 microseconds) is chosen so that eight requests will occur well prior to the maximum refresh time limit.

The NMI input is normally held "high" by resistor 134 and positive voltage source 136. A "low" input to the NMI input of CPU 100 causes it to enter an interrupt processing cycle. In accordance with conventional interrupt processing procedure, CPU 100 fetches an interrupt vector which indicates an address at which the interrupt routine begins. In accordance with the invention, this interrupt vector is chosen to be in the bank of the memory which is not normally accessed so that the fetching of the interrupt vector causes a refresh operation to be performed after the forced memory access. Thus, a refresh operation is always performed before the critical refresh time of the memory bank is reached.

In some cases, for example, with video information, it may be necessary to prohibit the refresh cycling to free the memory inputs 220. This can be by circuitry (not shown) which places a "low" BUSRFINH* signal on lead 174. This "low" signal immediately sets flip/flop 156 which, as described above, prevents the refresh cycle from occurring.

What is claimed is:

1. A memory refresh circuit for use in a computer system having a central processing unit and a dynamic memory including memory cells requiring periodic refreshing, said memory refresh circuit comprising,
    means for producing refresh request signals at predetermined intervals;
    means responsive to said refresh request signals for storing said request signals;
    means responsive to stored refresh request signals and responsive to a memory access by said central processing unit for starting a memory refresh cycle; and
    means responsive to the end of a refresh cycle and to said stored refresh request signals for immediately starting another memory refresh cycle so that refresh cycles are continuously performed until a refresh cycle has been performed for each stored refresh request signal.

2. A memory refresh circuit according to claim 1 wherein said refreshing means comprises means responsive to each of said stored refresh requests for designating one set of memory cells to be refreshed and means for changing said designation after said set has been refreshed.

3. A memory refresh circuit according to claim 2 further comprising means responsive to said stored refresh requests for continually refreshing said memory cell sets until a memory cell set has been refreshed for each stored refresh request.

4. A memory refresh circuit according to claim 1 further comprising means responsive to a predetermined number of stored refresh requests for generating an interrupt request to said central processing unit so that said central processing unit causes a memory access to occur in said memory.

5. A memory refresh circuit for use in a computer system having a central processing unit and a dynamic memory including memory cells requiring periodic refreshing, said memory refresh circuit comprising,
    means for producing refresh request signals at predetermined intervals;
    means responsive to said refresh request signals for storing said request signals;
    means responsive to a predetermined number of stored refresh requests for forcing initiation of a memory access by said central processing unit;
    means responsive to stored refresh request signals and responsive to said memory access by said central processing unit for starting a memory refresh cycle; and
    means responsive to the end of a refresh cycle and to said stored refresh request signals for immediately starting another memory refresh cycle so that refresh cycles are continuously performed until a refresh cycle has been peformed for each stored refresh request signal.

6. A memory refresh circuit according to claim 5 wherein said forcing means comprises
    means responsive to stored refresh request signals and responsive to a memory access by said central processing unit for refreshing said memory once for each stored refresh request signal, and
    means responsive to said predetermined number of stored refresh requests for generating an interrupt request to said central processing unit so that said central processing unit causes a memory access to occur in said memory.

7. A memory refresh circuit according to claim 6 wherein said refreshing means comprises means responsive to each of said stored refresh requests for designating one set of memory cells to be refreshed and means for changing said designation after said set has been refreshed.

8. A memory refresh circuit according to claim 7 further comprising means responsive to said stored refresh requests for continually refreshing said memory cell sets until a memory cell set has been refreshed for each stored refresh request.

9. A memory refresh circuit for use in a computer system having a central processing unit and a dynamic memory including memory cells requiring periodic refreshing, said memory refresh circuit comprising,
    a timer for producing refresh request signals at predetermined intervals;
    a counter;
    means responsive to said refresh request signals for incrementing said counter in response to each refresh request signal;

means responsive to a non-zero count in said counter and to a memory access by said central processing unit for starting a memory refresh cycle;

means responsive to the end of a memory refresh cycle for decrementing said counter; and means responsive to the end of a refresh cycle and to a non-zero count in said counter for immediately starting another memory refresh cycle so that refresh cycles are continuously performed until said counter reaches a zero count.

10. A memory refresh circuit according to claim 9 further comprising means responsive to a predetermined count in said counter for initiating an interrupt request to said central processing unit so that said central processing unit causes a memory access to occur in said memory.

11. A memory refresh circuit according to claim 10 wherein said refreshing means comprises means responsive to a non-zero count in said counter for designating one row of memory cells to be refreshed and means for changing said designation after said row has been refreshed.

12. A memory refresh circuit according to claim 11 wherein said refreshing means further comprises means responsive to a non-zero count in said counter for decrementing said counter after each row of memory cells has been refreshed.

13. A memory refresh circuit according to claim 12 further comprising means responsive to a non-zero count in said counter for continually refreshing said memory cell rows until the count in said counter has been decremented to zero.

14. A memory refresh circuit according to claim 13 wherein said central processing unit generates control signals indicating a memory access and said means for refreshing said memory in response to a memory access by said central processing unit comprises means startable to generate a plurality of timing signals at predetermined intervals and means responsive to said central processing unit control signals for starting said timing means.

15. A memory refresh circuit according to claim 14 wherein said means for refreshing said memory in response to a memory access by said central processing unit further comprises means responsive to one of said plurality of timing signals and to the count in said counter for generating a refresh signal when said count is non-zero.

16. A memory refresh circuit according to claim 15 wherein said means for refreshing said memory in response to a memory access by said central processing unit further comprises means responsive to said refresh signal and to another of said plurality of timing signals for restarting said timing means.

17. A memory refresh circuit for use in a computer system having a central processing unit including circuitry for generating a plurality of control signals indicating a memory access and a dynamic memory including memory cells requiring periodic refreshing, said memory refresh circuit comprising, a timer controlled by said central processing unit for producing refresh request signals at predetermined intervals;

a refresh request counter;

means responsive to said refresh request signals for incrementing said refresh request counter in response to each refresh request signal;

a refresh address counter for generating a plurality of refresh address signals specifying a particular memory cell row in said memory to be refreshed;

timing means startable to generate a plurality of timing signals at predetermined intervals;

means responsive to said central processor unit control signals for starting said timing means;

means responsive to timing signals generated by said timing means for disconnecting said memory from said central processing unit;

means responsive to said timing signals for refreshing the memory cell row specified by said refresh address signals;

means responsive to a non-zero count in said refresh request counter for decrementing said refresh request counter and for incrementing said refresh address counter after said specified row of memory cells has been refreshed;

means responsive to a non-zero count in said refresh request counter and responsive to another of said plurality of timing signals for immediately restarting said timing means so that rows of memory cells are continuously refreshed until the count in said refresh request counter has been reduced to zero; and means responsive to said timing signals and to a zero count in said refresh request counter for reconnecting said memory to said central processing unit.

18. A memory refresh circuit according to claim 17 further comprising means responsive to a predetermined count in said counter for initiating an interrupt request to said central processing unit so that said central processing unit causes a memory access to occur in said memory.

* * * * *